(12) United States Patent
Van Dam et al.

(10) Patent No.: US 8,675,176 B2
(45) Date of Patent: Mar. 18, 2014

(54) PARAMETER CONTROL IN A LITHOGRAPHIC APPARATUS USING POLARIZATION

(75) Inventors: Marinus Johanes Maria Van Dam, Venlo (NL); Wilhelmus Petrus De Boeij, Veldhoven (NL); Johannes Wilhelmus Wilhelmus De Klerk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1532 days.

(21) Appl. No.: 11/353,230

(22) Filed: Feb. 14, 2006

(65) Prior Publication Data

US 2006/0192149 A1    Aug. 31, 2006

Related U.S. Application Data

(60) Provisional application No. 60/655,905, filed on Feb. 25, 2005.

(51) Int. Cl.
  *G03B 27/72* (2006.01)
  *G03B 27/54* (2006.01)
  *G03B 27/32* (2006.01)

(52) U.S. Cl.
  USPC .................. 355/71; 355/67; 355/77

(58) Field of Classification Search
  USPC ............. 355/69, 71, 67, 77; 353/20; 356/399, 356/400
  See application file for complete search history.

(56) References Cited

U.S. PATENT DOCUMENTS

| | | | |
|---|---|---|---|
| 6,560,503 B1 * | 5/2003 | Toprac et al. ................. | 700/108 |
| 2001/0026448 A1 | 10/2001 | Koizumi et al. .............. | 362/268 |
| 2005/0100831 A1 * | 5/2005 | Finders et al. ................ | 430/322 |
| 2005/0146704 A1 * | 7/2005 | Gruner et al. .................. | 355/71 |
| 2006/0139611 A1 * | 6/2006 | Wagner et al. ................. | 355/71 |

* cited by examiner

*Primary Examiner* — William C Dowling
*Assistant Examiner* — Ryan Howard
(74) *Attorney, Agent, or Firm* — Pillsbury Winthrop Shaw Pittman LLP

(57) ABSTRACT

A lithographic apparatus includes an illuminator configured to provide a projection beam of radiation and a polarization controller configured to control an intensity of a preferred state of polarization of the projection beam. The lithographic apparatus further includes a support configured to hold a patterning device. The patterning device configured to pattern the projection beam according to a desired pattern. The apparatus also includes a substrate table configured to hold a substrate, and a projection system configured to project the patterned beam onto a target portion of the substrate to form a patterned image on the substrate.

21 Claims, 4 Drawing Sheets

PARAMETER CONTROL IN A LITHOGRAPHIC APPARATUS USING POLARIZATION

BACKGROUND

1. Related Application

This application claims priority to and the benefit of U.S. Provisional Application No. 60/655,905, filed Feb. 25, 2005, the entire contents of which is hereby incorporated by reference.

2. Field

The present invention relates to a lithographic apparatus and a method of making a device.

3. Background

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged, using a projection system, onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

Development of new apparatus and methods in lithography have led to improvements in resolution of the imaged features, such as lines and contact holes or vias, patterned on a substrate, possibly leading to a resolution of less than 50 nm. This may be accomplished, for example, using relatively high numerical aperture (NA) projection systems (greater than 0.75 NA), a wavelength of 193 nm or less, and a plethora of techniques such as phase shift masks, non-conventional illumination and advanced photoresist processes.

However, certain small features such as contact holes are especially difficult to fabricate. The success of manufacturing processes at sub-wavelength resolutions will rely on the ability to print low modulation images or the ability to increase the image modulation to a level that will give acceptable lithographic yield.

Typically, the industry has used the Rayleigh criterion to evaluate the critical dimension (CD) and depth of focus (DOF) capability of a process. The CD and DOF measures can be given by the following equations:

$$CD = k_1(\lambda/NA), \quad (1)$$

and $$DOF = k_2(\lambda/NA^2), \quad (2)$$

where $\lambda$ is the wavelength of the illumination radiation, $k_1$ and $k_2$ are constants for a specific lithographic process, and NA is the numerical aperture of the projection system.

Additional measures that provide insight into the difficulties associated with lithography at the resolution limit include the Exposure Latitude (EL), the Dense:Isolated Bias (DIB), and the Mask Error Enhancement Factor (MEEF). The exposure latitude describes the percentage dose range where the printed pattern's critical dimension (CD) is within acceptable limits. For example, the exposure latitude may be defined as the change in exposure dose that causes a 10% change in printed line width. Exposure Latitude is a measure of reliability in printing features in lithography. It is used along with the DOF to determine the process window, i.e., the regions of focus and exposure that keep the final resist profile within prescribed specifications. Dense:Isolated Bias is a measure of the size difference between similar features, depending on the pattern density. The MEEF describes how patterning device CD errors are transmitted into substrate CD errors. Other imaging factors that may be taken into account include the pitch. The pitch is a distance between two features such as, for example, contact holes. In a simplified approximation of coherent illumination, the resolution of a lithography system may also be quoted in terms of the smallest half-pitch of a grating that is resolvable as a function of wavelength and numerical aperture NA.

Among the trends in lithography is to reduce the CD by lowering the wavelength used, increasing the numerical aperture, and/or reducing the value of $k_1$. However, increasing the numerical aperture would also lead to a decrease in the DOF which ultimately could lead to limitations in process latitude.

The loss in DOF with high NA is well known. However, the polarization targets for high NA partially coherent systems have not been thoroughly examined. According to the following equation:

$$I(\vec{r}; z_0) = \sum_i \int_S d\vec{\rho}_0 S(\vec{\rho}_0) |FT^{-1}\{\tilde{O}(\vec{\rho} - \vec{\rho}_0) P_i(\vec{\rho}) F_i(\vec{\rho}; z) H_v(\vec{\rho}; \vec{r}, z_0)\}|^2 \quad (3)$$

$$I(r, Z_0) = \sum_i \int_S d\rho_0 S(\rho_0) |FT^{-1}\{O(\rho - \rho_0) P_i(\rho) F_i(\rho, z) H(\rho, r, Z_0)\}|^2,$$

where the image intensity I, in a given film such as a photoresist, is a function of position $\vec{r}$ and specific for a given focus position $z_0$. This equation is valid for all values of numerical aperture NA and the image is the summation over all polarization states i. The integral is over the source distribution defined by S with source positions described by $\vec{\rho}_0$. The inverse Fourier term within brackets represents the electric field distribution at the exit pupil. The four terms inside the bracket are, respectively, the object spectrum $\tilde{O}$ of the pattern of the patterning device (e.g., pattern of the reticle), a polarization matrix P, a film matrix F and a pupil matrix $H_v$.

The pupil matrix is considered as the Jones pupil matrix. Generally, an optical element and/or polarizing element placed in a path of an input optical beam can change the output electromagnetic field distribution. This action is given by the following equation.

$$E_{output} = J E_{input} \quad (4)$$
$$= \begin{bmatrix} J_{11} & J_{12} \\ J_{21} & J_{22} \end{bmatrix} \begin{bmatrix} E_x \\ E_y \end{bmatrix}$$
$$= \begin{bmatrix} E'_x \\ E'_y \end{bmatrix},$$

where J is known as the Jones matrix. In imaging theory, the values of E and J will be field dependent (given by the field vector, $\vec{r}$) but also dependent on the pupil position (given by pupil vector, $\vec{\rho}$). This gives rise to the lens pupils being described by a Jones matrix formalism.

Thus, following this formalism, the pupil matrix can be written as follows:

$$H_v(\vec{\rho};\vec{r}) = \begin{bmatrix} H_{xx}(\vec{\rho};\vec{r}) & H_{xy}(\vec{\rho};\vec{r}) \\ H_{yx}(\vec{\rho};\vec{r}) & H_{yy}(\vec{\rho};\vec{r}) \end{bmatrix} \quad (5)$$

$$= H(\vec{\rho};\vec{r}) \cdot \begin{bmatrix} A_{xx}e^{i\delta_{xx}} & A_{xy}e^{i\delta_{xy}} \\ A_{yx}e^{i\delta_{yx}} & A_{yy}e^{i\delta_{yy}} \end{bmatrix},$$

where the magnitude, A, the phases, δ, are explicit functions of pupil position $\vec{\rho}$ and field position $\vec{r}$. A scalar pupil, H, has been factored out of the matrix elements. The scalar is given by:

$$H(\vec{\rho};r,z_0) = A(\vec{\rho};\vec{r})e^{-ik_0 z_0 \gamma}e^{-ik_0 W(\vec{\rho},\vec{r})}\sqrt{\frac{\gamma_{input}}{\gamma}}, \quad (6)$$

where W describes the wave front aberrations, and $\gamma_{input}$ and $\gamma$ are direction cosines at the entrance and exit pupils. Lenses that have birefringence will have pupil matrices defined by equation (5). The lens, in effect, will behave (within local pupil coordinates) as a polarization filter with representative Jones matrix. However, if the lens has aberration but no polarization behaviour then it is sufficient to use a simple scalar pupil function H.

The object intensity distribution is determined by the electric field at the plane of the patterning device. This form does not place restrictions on whether the field is based on a Kirchhoff representation or the more rigorous Maxwell equation solution of the electric field from a patterning device with finite features. For the Kirchhoff approximation, the illumination polarization will determine the x and/or y component amounts of the electric field. However, for the more rigorous calculation the spectrum is dependent on the interaction between the patterning device (e.g., reticle) topography and the illumination polarization in a non-trivial manner.

Hence, according to the general equation (3), high NA imaging is intrinsically linked with the polarization state and the thin film structure, where the electric field coupling and the power absorbed by a photoresist film can be drastically altered. As a result, the imaging properties on the resist can be altered which may include variations in linewidth, image contrast, and critical dimension (CD). The image contrast is a conventional image metric useful for small equal line/space patterns, the image contrast is defined as the difference between the maximum and minimum intensities in an image divided by the sum of maximum and minimum intensities.

SUMMARY

According to an aspect of the present invention, there is provided a lithographic apparatus including an illuminator configured to provide a projection beam of radiation, a polarization controller configured to control an intensity of a preferred state of polarization of the projection beam, and a support configured to hold a patterning device. The patterning device is configured to pattern the projection beam according to a desired pattern. The apparatus further includes a substrate table configured to hold a substrate, and a projection system configured to project the patterned beam onto a target portion of the substrate to form a patterned image on the substrate.

According to another aspect of the present invention there is provided a method for enhancing or adjusting a parameter of an image in a lithographic apparatus. The method includes controlling an intensity of a preferred state of polarization of a radiation beam, and patterning the radiation beam with a patterning device. The method further includes projecting the patterned radiation onto a target portion of a layer of radiation sensitive material on a substrate to form an image, wherein a parameter of the image is enhanced with the control of the intensity of the preferred stated of polarization of the radiation beam.

According to yet another aspect of the present invention there is provided a method for manufacturing a device in a lithographic apparatus. The method includes illuminating a patterning device with a radiation beam, controlling an intensity of a preferred state of polarization of the radiation beam, and patterning the radiation beam with the patterning device. The method further includes projecting the patterned radiation onto a target portion of a layer of radiation sensitive material on a substrate to form a patterned image on the layer of radiation sensitive material.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm).

The term "patterning device" used herein should be broadly interpreted as referring to any device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic apparatus, for example, between the patterning device and a first element of the projection system. Immersion techniques are well known in the art for increasing the numerical aperture of projection systems.

The methods described herein may be implemented as software, hardware or a combination. In an embodiment, there is provided a computer program comprising program code that, when executed on a computer system, instructs the computer system to perform any or all of the methods described herein.

BRIEF DESCRIPTION OF THE DRAWINGS

These and other aspects of the invention will become more apparent and more readily appreciated from the following detailed description of the present exemplary embodiments of the invention, taken in conjunction with the accompanying drawings, of which.

DETAILED DESCRIPTION

Figure 1:
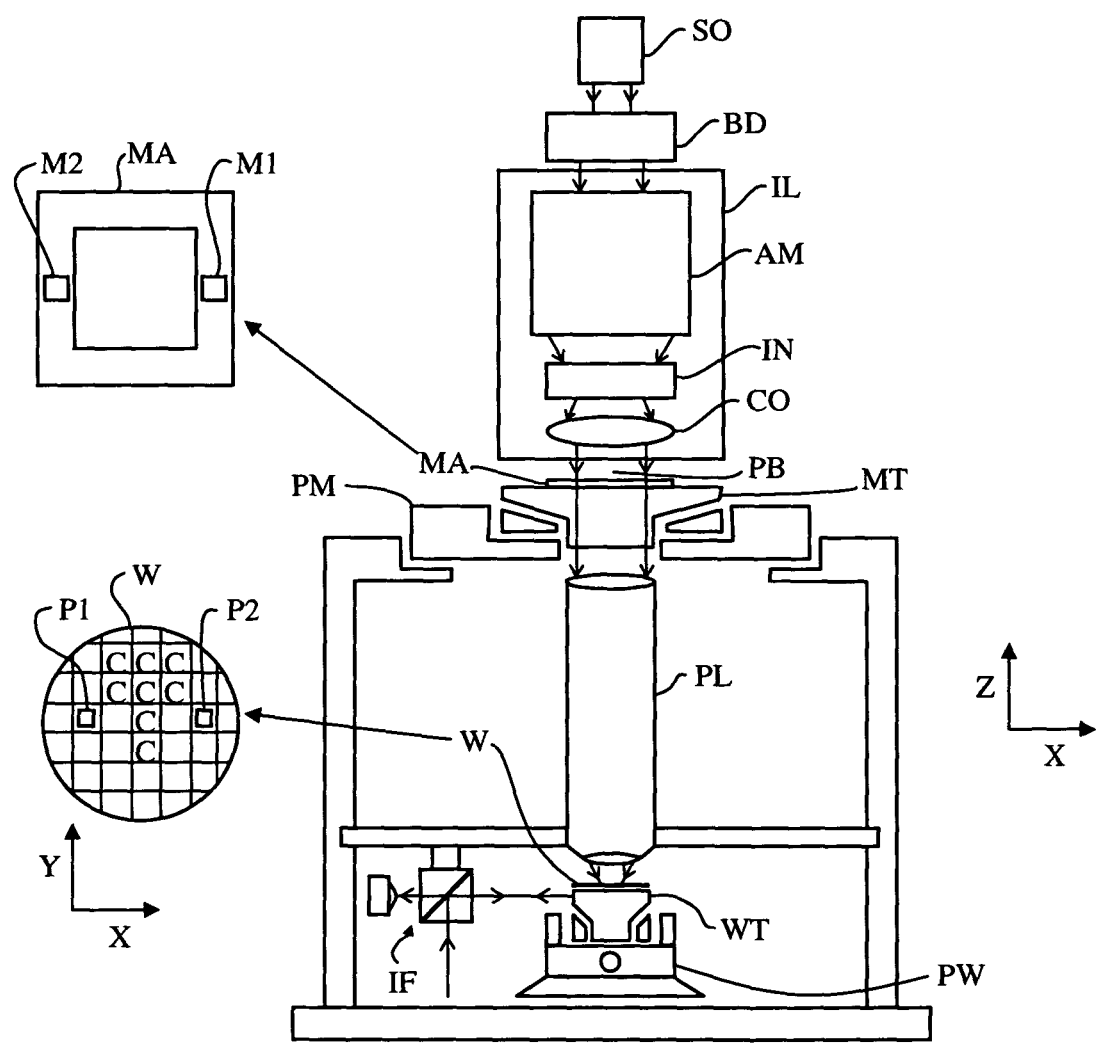
FIG. 1 schematically depicts a lithographic projection apparatus according to an embodiment of the invention.

FIG. 1 schematically depicts a lithographic apparatus according to a particular embodiment of the invention. The apparatus includes:
   an illumination system (illuminator) IL adapted to condition a beam PB of radiation (e.g. UV radiation),
   a support structure (e.g. a mask table) MT configured to hold a patterning device (e.g. a mask) MA and connected to first positioning device PM configured to accurately position the patterning device with respect to item PL;
   a substrate table (e.g. a wafer table) WT configured to hold a substrate (e.g. a resist-coated wafer) W and connected to second positioning device PW configured to accurately position the substrate with respect to item PL; and
   a projection system (e.g. a refractive projection lens) PL adapted to image a pattern imparted to the beam PB by the patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the patterning device MA, which is held on the support structure MT. Having traversed the patterning device MA, the projection beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the support structure MT and the substrate table WT will be realized with the aid of a long-stroke module (coarse positioning) and a short-stroke module (fine positioning), which form part of the one or both of the positioning devices PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2. The depicted apparatus can be used in the following preferred modes:

1. In step mode, the support structure MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the projection beam is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

A need exits to control polarization in lithographic apparatuses in order, for example, to enhance the contrast level of an image, enhance the CD or enhance the resolution. The quality of polarization of the illumination used to illuminate the patterning device plays an increasing role, especially with the advent of high NA systems (with the introduction of an immersion liquid between the projection system and the substrate). The quality of polarization illumination can have an impact on the quality (for example, contrast, CD and pitch) of the imaged features transferred to the resist on the substrate.

For example, if a linear polarization is required, but the illuminator results in elliptical polarization, this may change the overall contrast of the imaging. Hence, it is desirable to quantify various polarization metrics.

Figures 2, 3:
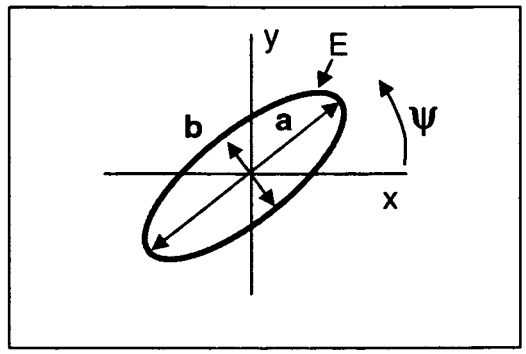
FIG. 2 depicts a graphical representation of an elliptical polarization.
FIG. 3 shows a visualization of the intensity of desired polarization and polarization orientation in a matrix of varying amounts of degree of polarization and polarization purity parameters.

FIG. 2 shows the polarization ellipse for an electric field vector $E_0$ with x,y-components $E_{0x}$ and $E_{0y}$. An ellipticity, $\epsilon$, of the ellipse can be defined simply as the ratio of the minor to major axis (the ellipticity is $\epsilon=b/a$). In addition, an orientation angle $\Psi$ can be defined as the angle of the major axis to X-axis. The phase delay between the two orthogonal field vectors and can be shown to be related to the orientation and ellipticity by the following equation:

$$\tan 2\Psi = \frac{2E_{0x}E_{0y}\cos\delta}{E_{0x}^2 + E_{0y}^2}, \tag{7}$$

where $\delta=\delta_y-\delta_x$ is the phase delay. Therefore, the parameters, $\epsilon$ and $\Psi$, can be fairly good indicators of polarization state of exposing radiation. It is noted that the absolute phases are not preserved in these terms, but it is the relative phase difference which causes effects.

The polarization quality may be based on the specification or target polarization that is desired. A convenient metric is defined as the polarization purity (PP) or the percentage of polarized radiation that is in the targeted or preferred polarization state. Mathematically the polarization purity (PP) can be defined as:

$$PP=\|E_{Target} \cdot E_{Actual}\|^2 \times 100, \tag{8}$$

where $E_{Target}$ and $E_{Actual}$ are electric field vectors of unit length.

As an example of this metric, consider that only Y-polarized radiation is desired to expose the patterning device, but the resulting output illumination has been rotated 45°. With these assumptions, the PP can be calculated by the following equation.

$$\begin{aligned} PP &= \| E_{y-polarized} \cdot E_{45-polarized}\|^2 \times 100 \\ &= \left\| \begin{bmatrix} 0 \\ 1 \end{bmatrix} \cdot \frac{1}{\sqrt{2}} \begin{bmatrix} 1 \\ 1 \end{bmatrix} \right\|^2 \times 100 \\ &= 50\%, \end{aligned} \tag{9}$$

In this case, 50% of the radiation is in the wrong polarization state. Although PP is a valuable metric it does not completely define the illuminating radiation. A fraction of the radiation can be undefined or de-polarized, where the electric vectors rotate within a timeframe beyond our observation period. This can be classified as unpolarized radiation. If radiation is considered to be the sum of polarized radiation and unpolarized radiation, it is possible to define a degree of polarization (DOP) by the following equation:

$$DOP = \frac{I_{polarized}}{I_{Total}} = \frac{I_{polarized}}{I_{polarized} + I_{unpolarized}}. \tag{10}$$

Polarized radiation can be defined by 4 measurable quantities, $(S_0, S_1, S_2, S_3)$. These are known as the Stokes parameters or the Stokes vector. The first parameter, $S_0$, expresses the total intensity of the optical field. The next three describe the polarized intensity of the X or Y polarized radiation, the 45 or 135 polarized radiation and the circularly polarized radiation, respectively These terms directly apply to measurable intensity that is used to expose a resist. Furthermore, unlike Jones vectors, the Stokes parameters make no requirement on whether the radiation is polarized or unpolarized. The DOP is redefined as:

$$S = \begin{bmatrix} S_0 \\ S_1 \\ S_2 \\ S_3 \end{bmatrix} \quad (11)$$

$$= S_0 \begin{bmatrix} 1 \\ \cos 2\Psi \cos 2\varepsilon \\ \sin 2\Psi \cos 2\varepsilon \\ \sin 2\varepsilon \end{bmatrix}.$$

Although PP is a good metric for polarized radiation, DOP may be needed to account for unpolarized portions. Since unpolarized (and polarized) radiation can be decomposed into 2 orthogonal states, an equation for the total intensity in the preferred state (IPS) of polarization as a function of DOP and PP can be derived, i.e., $$IPS = \frac{1}{2} + DOP \cdot \left(PP - \frac{1}{2}\right). \quad (12)$$

FIG. 3 illustrates some combinations of DOP and PP using a mixture of linear polarization and unpolarized radiation. FIG. 3 shows a visualization of the intensity in the desired polarization state or IPS and various combinations of linearly polarized radiation and unpolarized radiation in a matrix of varying amounts of DOP and PP. For example, in order to obtain an IPS equal to zero, the output state needs to be completely orthogonal to the input state. An output state of unpolarized radiation will still contain 50% in an orthogonal polarization, hence it will have an IPS equal to 0.5.

Since the Stokes vector relationships are known and assuming that linear polarization is the preferred state, one can further derive:

$$IPS = \frac{S_0 + S_1}{2S_0} = \frac{1}{2} + \frac{1}{2} DOP \cdot \cos 2\Psi \cos 2\varepsilon. \quad (13)$$

If the angle, $\Psi$, is relative to the preferred polarization axis, then for a desired polarization in either the X or Y directions, with $\varepsilon = 0$ and DOP=1, the IPS=1.0. For linearly polarized radiation, $\Psi$, $\varepsilon$, and DOP can be considered as error terms from the desired state. Therefore, this equation relates the quality of the polarized radiation to the amount of intensity that will ultimately expose the resist. Since the IPS is related directly to the exposure dose, the variation of IPS across an image field is directly related to CD-uniformity (CDU) across the exposure field.

The response of a 45 nm vertical dense line was simulated using matched dipole illumination assuming a water immersion system at NA=1.35 with a 4× reduction ratio. Polarized dipole illumination along the y axis was chosen as the preferred state of polarization, as this maximized the process window. The dipole centers and radius were at a partial coherence of $\sigma_{center}$=0.79 and radius of $\sigma_{radius}$=0.15, respectively. The simulation, within this section, assumed a infinitely thin mask (Kirchhoff approximation) and used vector imaging theory with full photoresist development model. Two commercial simulators were used as a comparison: 1) PANORAMIC™ Technologies EM Suite software, and 2) KLA-Tencor's PROLITH™ software.

Figure 4:
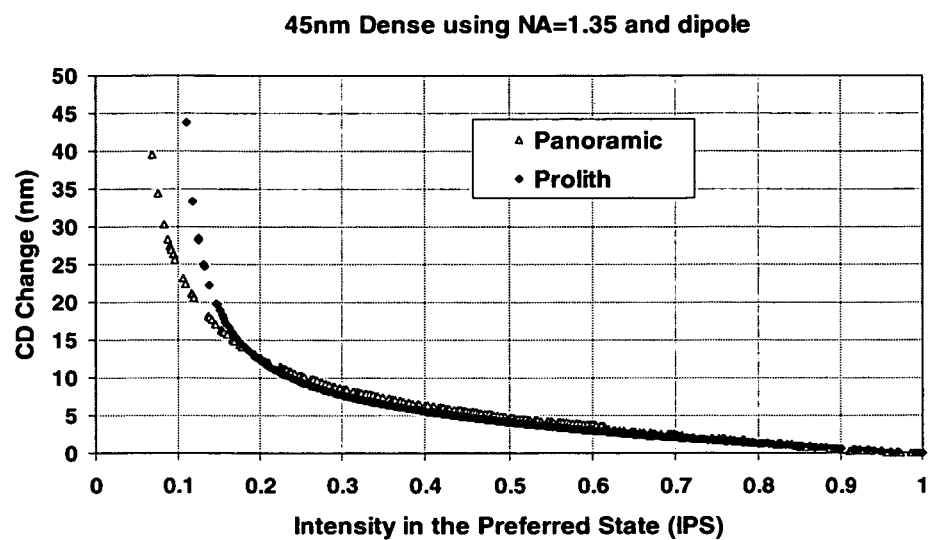
FIG. 4 shows a graph of results of a simulation using two lithographic simulation codes in which the critical dimension is plotted as a function of the intensity of radiation in the preferred state.

FIG. 4 shows the results where the CD change from the preferred state is plotted as a function of IPS. The IPS values were created running a matrix of $\varepsilon$ and $\psi$ for the PANORAMIC™ software resulting in approximately 300 combinations, while a matrix of $\varepsilon$, $\psi$ and DOP was run for the PROLITH™ software resulted in approximately 1000 values.

As can be seen, the change in CD is a monotonic function with a unique IPS value associated with a CD change. The agreement between simulators, especially for IPS values greater than 0.7 is extremely good.

Hence, by manipulating the polarization via accessible metrics such as the IPS, the inventors have determined that it is possible to control the contrast of an image or other parameters of an image such as the CD and a CD-pitch dependency. In the presence of both isolated and dense features in the pattern, i.e., in the presence of features arranged at both large and small pitches, the printed CD of a feature may vary in accordance with the pitch at which that feature is arranged in the pattern. This effect is referred to as "iso-dense bias," and a CD-pitch dependency of an apparatus is referred to as an "iso-bias characteristic." The specific iso-dense bias characteristic of an apparatus can be controlled and or adjusted by controlling and or adjusting the IPS, according to an embodiment of the present invention. Because IPS is a function of PP and DOP, controlling the IPS includes controlling the polarization purity PP of the radiation and/or controlling the degree of polarization (DOP) of the radiation. This can be done, for example, to enhance the contrast of an image or to adjust the iso-dense bias characteristic of a lithographic apparatus. In the case of enhancing the contrast of an image, this may desirable in applications where higher contrast imaging is sought. However, the option to adjust the iso-dense bias characteristic may also be desirable in certain circumstances, for example, where the intent is to match the iso-dense characteristic of one (a first) lithographic apparatus to an iso-dense bias characteristic of another (a second) lithographic apparatus, with the effect that a pattern on a patterning device is imaged similarly with respect to iso-dense bias irrespective of whether the reticle is used on the first or the second apparatus. The ability to manipulate CD-pitch behavior through manipulating polarization metrics in the first lithographic apparatus in order to achieve a certain level of polarization such that CD-pitch dependencies of the first and second lithographic apparatuses can be matched is referred to as proximity matching.

Figures 5A, 5B:
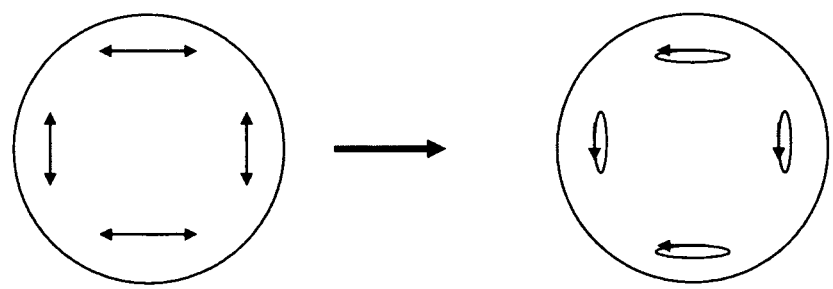
FIGS. 5A and 5B, show, respectively, a linear perfect polarization state and an elliptical polarization state.

In an embodiment of the invention, proximity matching across a set of lithographic apparatus can be achieved by manipulating the polarization metrics by, for example, inserting a quarter-wave plate ($\lambda/4$ plate) at a bottom of illuminator IL (see FIG. 1). If for example "a perfect polarization" such as a pure linear polarization (shown in FIG. 5A) is achievable in the first apparatus but not in the second apparatus, the level of linear polarization state can be made slightly elliptical (shown in FIG. 5B) in the first apparatus with application of a polarization bias to match the polarization capabilities (translating into, for example, image contrast capabilities) of the second apparatus.

Figure 6:
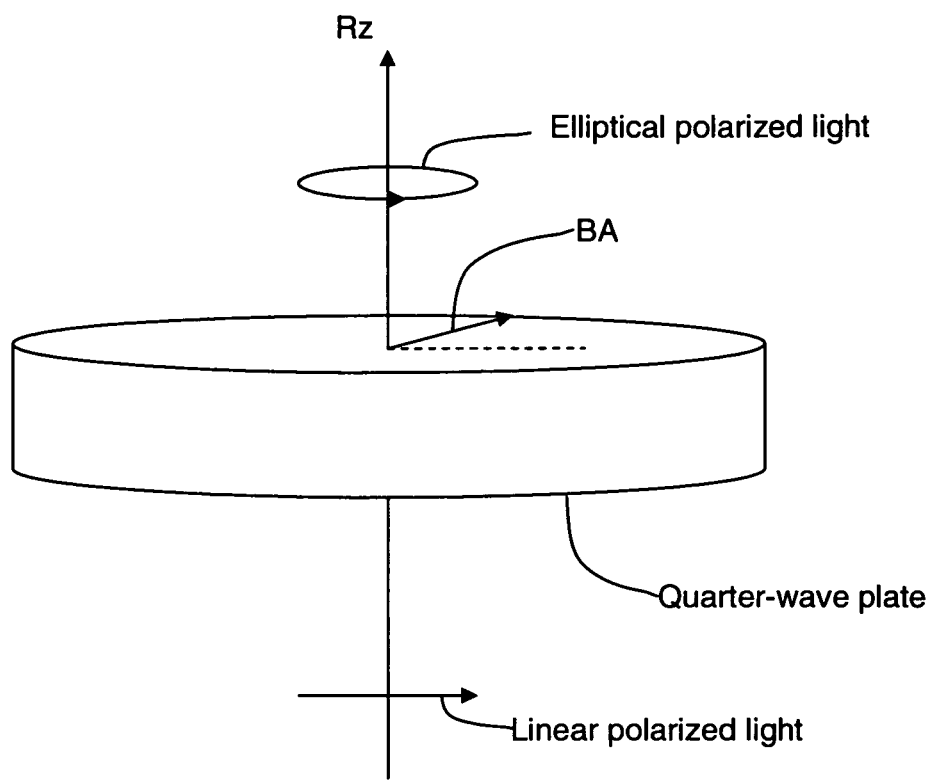
FIG. 6 shows an example of a quarter-wave plate which can be incorporated in a lithographic apparatus to control polarization levels according to an embodiment of the present invention.

FIG. 6 shows an example of a quarter-wave plate which can be incorporated in the first apparatus to induce controllable IPS losses to match the polarization capabilities of the second apparatus. The birefringent crystal axis BA of the quarter-wave plate may be oriented along the X or Y axis of the polarization directions. By slightly rotating the quarter-wave plate, i.e. the crystal, along the Rz axis, an ellipticity ($\varepsilon = b/a$, see FIG. 2) can be imposed on the linear polarization and thus convert the linear polarized radiation into elliptical polarized radiation in a first lithographic apparatus which may propagate all the way to the patterning device level MA (see FIG. 1) in order to match an elliptical polarization of in a second lithographic apparatus.

Hence with use of a birefringent quarter-wave plate, controlled IPS losses may be achieved. This property may be used to control IPS and thus perform proximity matching. This method works for all pupil illuminations and modes that include separate X, Y, TE and/or TM polarization directions. This enables proximity matching across a plurality of lithographic apparatuses. For example, with the present method it may be possible to achieve a proximity matching of a first lithographic apparatus with higher polarization performance level to a second lithographic apparatus having a lower polarization performance level by lowering the polarization level in the first lithographic apparatus.

Since numerous modifications and changes will readily occur to those of skill in the art, it is not desired to limit the invention to the exact construction and operation described herein. For example, while a quarter-wave plate exhibiting birefringence is discussed herein as a way to induce controlled IPS losses, it should be appreciated that other configurations are also contemplated, including controlling polarization at a radiation source and the use of other types of polarizing optical elements. For example, in a lithographic apparatus using $CaF_2$ lenses having an intrinsic birefringence, clocking one or more of the lenses can produce changes in polarization states.

Moreover, the process, method and apparatus of the present invention, like related apparatus and processes used in the lithographic arts, tend to be complex in nature and are often best practiced by empirically determining the appropriate values of the operating parameters or by conducting computer simulations to arrive at a best design for a given application. Accordingly, all suitable modifications and equivalents should be considered as falling within the spirit and scope of the invention.

What is claimed is:

1. A method for enhancing or adjusting a parameter of an image in a lithographic apparatus, comprising:
   controlling an intensity of a preferred state of polarization of a radiation beam by controlling the polarization purity of the radiation beam, or the degree of polarization of the radiation beam, or both, the controlling further comprising determining a polarization performance level of a different lithographic apparatus and controlling the intensity of the preferred state of polarization of the radiation beam to correspond to an intensity of a preferred state of polarization of a radiation of the different lithographic apparatus;
   patterning the radiation beam with a patterning device; and
   projecting the patterned radiation onto a target portion of a layer of radiation sensitive material on a substrate to form an image, wherein at least one parameter of the image selected from the parameters of image contrast, critical dimension, critical dimension pitch, or iso-dense bias characteristic is enhanced or adjusted with the control of the intensity of the preferred state of polarization of the radiation beam, wherein the intensity of the preferred state of polarization is a linear function of a polarization purity of the radiation beam and a degree of polarization of the radiation beam.

2. The method of claim 1, wherein IPS=0.5+DOP (PP−0.5), wherein IPS is the intensity of the preferred state of polarization, DOP is the degree of polarization, and PP is the polarization purity.

3. The method of claim 1, wherein the controlling comprises controlling an optical element of the lithographic apparatus.

4. The method of claim 3, wherein the optical element is a quarter-wave plate and the controlling the optical element comprises rotating the quarter-wave plate.

5. The method of claim 1, wherein the controlling comprises controlling a polarization of an output of a radiation source providing the radiation beam.

6. A method of manufacturing a device in a lithographic apparatus, comprising:
   illuminating a patterning device with a radiation beam;
   controlling an intensity of a preferred state of polarization of the radiation beam by controlling the polarization purity of the radiation beam, or the degree of polarization of the radiation beam, or both, wherein the intensity of the preferred state of polarization is a linear function of a polarization purity of the radiation beam and a degree of polarization of the radiation beam, the controlling the intensity of the preferred state of polarization of the radiation beam enhances or adjusts at least one parameter of the patterned image selected from the parameters of image contrast, critical dimension, critical dimension pitch, or iso-dense bias, and the controlling further comprises determining a polarization performance level of a different lithographic apparatus and controlling the intensity of the preferred state of polarization of the radiation beam to correspond to an intensity of a preferred state of polarization of a radiation of the different lithographic apparatus;
   patterning the radiation beam with the patterning device; and
   projecting the patterned radiation onto a target portion of a layer of radiation sensitive material on a substrate to form a patterned image on the layer of radiation sensitive material.

7. The method of claim 6, wherein IPS=0.5+DOP (PP−0.5), wherein IPS is the intensity of the preferred state of polarization, DOP is the degree of polarization, and PP is the polarization purity.

8. The method of claim 6, wherein the controlling comprises controlling an optical element of the lithographic apparatus.

9. The method of claim 8, wherein the optical element is quarter-wave plate and the controlling the optical element comprises rotating the quarter-wave plate.

10. The method of claim 6, wherein the controlling comprises controlling a polarization of an output of a radiation source providing the radiation beam.

11. A method of providing proximity matching across a plurality of lithographic apparatuses, comprising:
    controlling a level of polarization in a first actual lithographic apparatus to match a polarization level in a second actual lithographic apparatus to proximity match the first and second lithographic apparatuses.

12. The method of claim 11, wherein controlling a level of polarization in the first lithographic apparatus comprises controlling an intensity in a preferred state of polarization of a radiation beam in the first apparatus to match the polarization level in the second polarization apparatus.

13. The method of claim 12, wherein controlling the intensity in the preferred state of polarization of the radiation beam comprises inducing controllable losses in the intensity in the preferred state of polarization of the radiation beam.

14. The method of claim 12, wherein controlling an intensity in a preferred state of polarization of a radiation beam in the first apparatus to match the polarization level in the second polarization apparatus is performed to match an iso-dense bias characteristic of the first lithographic apparatus to an iso-dense bias characteristic of the second lithographic apparatus.

15. The method of claim 12, wherein controlling an intensity in a preferred state of polarization of a radiation beam in the first apparatus to match the polarization level in the second polarization apparatus is performed to match a critical dimension pitch behavior in an image obtained with the first lithographic apparatus to a critical dimension pitch behavior in an image obtained with the second lithographic apparatus.

16. The method of claim 11, wherein the controlling comprises controlling an optical element in a projection system of the first lithographic apparatus.

17. The method of claim 16, wherein the controlling comprises rotating a plate in the first lithographic apparatus to convert a substantially perfect polarization in the first lithographic apparatus into an elliptical polarization in the first lithographic apparatus to match an elliptical polarization of the second lithographic apparatus.

18. The method of claim 17, wherein said plate is a quarter-wave plate.

19. The method of claim 18, wherein said plate comprises a birefringent material and the plate is rotated such that a birefringent crystal axis of the material is oriented in a polarization direction.

20. A lithographic apparatus, comprising:
an illuminator configured to provide a projection beam of radiation;
a polarization controller configured to control an intensity of a preferred state of polarization of the projection beam by control of the polarization purity of the radiation beam, or of the degree of polarization of the radiation beam, or of both, wherein the intensity of the preferred state of polarization is a linear function of a polarization purity of the projection beam and a degree of polarization of the projection beam, to enhance or adjust at least one parameter of the patterned image selected from the parameters of image contrast, critical dimension, critical dimension pitch, or iso-dense bias and to correspond to an intensity of a preferred state of polarization of a radiation of a different lithographic apparatus based on a polarization performance level determined for the different lithographic apparatus;
a support configured to hold a patterning device, the patterning device configured to pattern the projection beam according to a desired pattern;
a substrate table configured to hold a substrate; and
a projection system configured to project the patterned beam onto a target portion of the substrate to form a patterned image on the substrate.

21. The apparatus of claim 20, wherein IPS=0.5+DOP (PP−0.5), wherein IPS is the intensity of the preferred state of polarization, DOP is the degree of polarization, and PP is the polarization purity.

* * * * *

UNITED STATES PATENT AND TRADEMARK OFFICE
CERTIFICATE OF CORRECTION

| | | |
|---|---|---|
| PATENT NO. | : 8,675,176 B2 | Page 1 of 1 |
| APPLICATION NO. | : 11/353230 | |
| DATED | : March 18, 2014 | |
| INVENTOR(S) | : Marinus Johannes Maria Van Dam et al. | |

It is certified that error appears in the above-identified patent and that said Letters Patent is hereby corrected as shown below:

On title page, Item (75) Inventors, Line 1
 replace "Johanes"
 with --Johannes--.

On title page, Item (75) Inventors, Line 4
 replace "Wilhelmus Wilhelmus De Klerk,"
 with --Wilhelmus De Klerk--.

Signed and Sealed this
Nineteenth Day of August, 2014

Michelle K. Lee
*Deputy Director of the United States Patent and Trademark Office*